(12) United States Patent
Basol

(10) Patent No.: US 8,163,090 B2
(45) Date of Patent: Apr. 24, 2012

(54) METHODS STRUCTURES AND APPARATUS TO PROVIDE GROUP VIA AND IA MATERIALS FOR SOLAR CELL ABSORBER FORMATION

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 996 days.

(21) Appl. No.: 11/953,822

(22) Filed: Dec. 10, 2007

(65) Prior Publication Data

US 2009/0148669 A1    Jun. 11, 2009

(51) Int. Cl.
*C23C 16/00* (2006.01)
(52) U.S. Cl. .............. 118/718; 118/726; 427/255.5
(58) Field of Classification Search .......... 118/718, 118/726; 204/298.24; 427/255.5
See application file for complete search history.

(56) References Cited

U.S. PATENT DOCUMENTS

| | | | |
|---|---|---|---|
| 4,265,859 A | 5/1981 | Jewett | |
| 4,542,711 A | 9/1985 | Izu et al. | |
| 4,543,275 A * | 9/1985 | Akashi et al. .............. | 427/250 |
| 4,563,976 A | 1/1986 | Foell et al. | |
| 5,015,503 A | 5/1991 | Varrin et al. | |
| 5,578,503 A | 11/1996 | Karg et al. | |
| 6,190,937 B1 | 2/2001 | Nakagawa et al. | |
| 6,217,649 B1 | 4/2001 | Wallace et al. | |
| 6,281,098 B1 | 8/2001 | Wang et al. | |
| 7,194,197 B1 | 3/2007 | Wendt et al. | |
| 2003/0145792 A1 * | 8/2003 | Honda et al. .............. | 118/726 |
| 2005/0092236 A1 | 5/2005 | Bender | |
| 2006/0096537 A1 | 5/2006 | Tuttle | |
| 2007/0169695 A1 | 7/2007 | Schneiders et al. | |
| 2008/0023070 A1 | 1/2008 | Sinha | |
| 2008/0095938 A1 | 4/2008 | Basol | |

FOREIGN PATENT DOCUMENTS

| | | |
|---|---|---|
| EP | 0 318 315 | 5/1989 |
| JP | 2002217213 | 8/2002 |
| JP | 2003273135 | 9/2003 |
| JP | 2003282600 | 10/2003 |
| WO | WO 01/37324 | 5/2001 |
| WO | WO 2006/047207 | 5/2006 |
| WO | WO 2007/047888 | 4/2007 |
| WO | WO 2008/085604 | 7/2008 |

OTHER PUBLICATIONS

International Search Report issued Sep. 2, 2009 in corresponding PCT/US08/085918.
International Search Report issued Jul. 31, 2009 in corresponding PCT/US2009/46072.

* cited by examiner

*Primary Examiner* — Karla Moore
(74) *Attorney, Agent, or Firm* — Pillsbury Winthrop Shaw Pittman LLP

(57) ABSTRACT

A process and apparatus which form a solar cell absorber on a surface of a workpiece as the workpiece and a carrier are advanced through a rapid thermal processing (RTP) chamber. In one embodiment, the surface of the workpiece includes a precursor layer and an absorber constituent is disposed on the carrier. Initially an absorber constituent vapor can be formed in the RTP chamber by advancing the carrier into the RTP chamber to vaporize the absorber constituent from the carrier. The workpiece with the precursor layer is then moved into the RTP chamber to react the absorber constituent vapor and the precursor layer to form an absorber layer on the workpiece.

11 Claims, 4 Drawing Sheets

METHODS STRUCTURES AND APPARATUS TO PROVIDE GROUP VIA AND IA MATERIALS FOR SOLAR CELL ABSORBER FORMATION

BACKGROUND OF THE INVENTION

The present invention relates to method and apparatus for preparing thin films of semiconductor films for radiation detector and photovoltaic applications.

DESCRIPTION OF THE RELATED ART

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. Alkali metals of Group IA, such as K, Na and Li are often included in the CIGS(S) absorbers as dopants to improve their photovoltaic properties.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. The substrate 11 and the conductive layer 13 form a base 20. Various conductive layers comprising Mo, Ta, W, and Ti have been used in the solar cell structure of FIG. 1. If the substrate itself is a properly selected conductive material such as Ta foil, Mo foil etc., it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA constituents in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. However, for simplicity, the value of k will be referred to here as equal to 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

One technique for growing $Cu(In,Ga)(S,Se)_2$ type compound thin films for solar cell applications is a two-stage process where metallic components or constituents of the $Cu(In,Ga)(S,Se)_2$ material, i.e. Cu, In and Ga, are first deposited onto a substrate, and then reacted with the non-metallic constituents (or semi-metallic constituents), i.e. S and/or Se, in a high temperature annealing process. For example, for $CuInSe_2$ growth, thin layers of Cu and In are first deposited on a substrate and then this stacked precursor layer is reacted with Se (selenization) at elevated temperature. If the reaction atmosphere also contains sulfur (sulfidation or sulfurization), then a $CuIn(S,Se)_2$ layer can be grown. Alternatively, a $CuIn(S,Se)_2$ layer may be obtained by first selenization and then sulfidation of a metallic precursor comprising Cu and In. Addition of Ga in the precursor layer, i.e. use of a Cu/In/Ga stacked film precursor, allows the growth of a Cu(In,Ga)(S,Se)_2$, or CIGSS absorber.

Two-stage process approach may also employ stacked layers comprising Group VIA materials. For example, a $Cu(In,Ga)Se_2$ film may be obtained by depositing In—Ga—Se and C—Se layers in an In—Ga—Se/Cu—Se stack and reacting them in presence of Se. Here In—Ga—Se represents reacted precursors of indium gallium selenide and Cu—Se represents copper selenide. Similarly, stacks comprising Group VIA materials and metallic constituents or components may also be used. Stacks comprising Group VIA materials and metallic constituents include, but are not limited to In—Ga—Se/Cu/Se stack, Cu/In/Ga/Se stack, Cu/Se/In/Ga/Se stack, etc., where Se may be placed at various positions in the stack.

Selenization and/or sulfidation of precursor layers comprising metallic components may be carried out in various forms of Group VIA material(s). One approach involves using Group VIA material containing gases such as $H_2Se$, $H_2S$, Se and/or S containing organometallics or their mixtures to react, either simultaneously or consecutively, with the precursors comprising Cu, In and/or Ga. This way a $Cu(In,Ga)(S,Se)_2$ film may be formed after annealing and reacting at elevated temperatures, which are typically in the 400-600 C range. It is possible to increase the reaction rate or reactivity by striking plasma in the reactive gas during the process of compound formation. Selenium vapors or S vapors from heated elemental sources may also be used for selenization and sulfidation. In this case Se and/or S may be heated in a container and their vapors may be carried by a carrier gas such as an inert gas to the reactor where the precursor layer is converted into a Group IBIIIAVIA compound film. Alternately, as described before, Se and/or S may be deposited over a metallic precursor layer comprising Cu, In and/or Ga and then the stacked structure or precursor can be annealed at elevated temperatures to initiate reaction between the metallic elements or components and the Group VIA material(s) to form the $Cu(In,Ga)(S,Se)_2$ compound.

Reaction step in a two-stage process is typically carried out in batch furnaces. In this approach, a number of pre-cut substrates with precursor layers deposited on them are placed into a reaction chamber of a batch furnace. The furnace door is closed and sealed. Then the reaction chamber is pumped and purged with necessary gases and reaction is carried out for a period that may range from 5 minutes to several hours. Temperature of the batch furnace is typically raised to the reaction temperature, which may be in the range of 400-600° C., after loading the substrates and establishing the reaction environment, such as the gaseous environment, within the reactor. The ramp rate for this temperature rise is normally lower than 5° C./sec, typically less than 1° C./sec.

One prior art method described in U.S. Pat. No. 5,578,503 utilizes a rapid thermal processing or annealing (RTP) approach to react the precursor layers in a batch manner, one substrate at a time. In this design the temperature of the substrate with the precursor layer is raised to the reaction temperature at a high rate, typically at around 10° C./sec.

Design of the reaction chamber to carry out selenization/sulfidation processes is critical for the quality of the resulting compound film, the efficiency of the solar cells, throughput, material utilization and cost of the process. Therefore, there is need for new approaches and tools to carry out the reaction of precursor layers to form high quality, low cost CIGS type absorber layers for solar cells.

SUMMARY

The present invention provides a method and apparatus which employ constituents vaporized from a constituent delivery surface to form a solar cell absorber layer on a workpiece by reacting the vaporized constituents with a precursor layer on the workpiece. In one embodiment, the constituent delivery surface is a surface of a continuous carrier which is used alongside the continuous flexible workpiece within a roll-to-roll RTP apparatus of the present invention. In another embodiment, both the constituent delivery surface and the precursor layer are on a continuous flexible workpiece.

An aspect of the present invention provides a thermal processing tool for forming a solar cell absorber by reacting a precursor layer disposed on a surface of a continuous flexible workpiece. The reaction takes place within the precursor layer and with an absorber ingredient from a carrier layer. The thermal processing tool includes a heating chamber to cause therein the reacting of a precursor layer portion of the precursor layer with that part of the absorber ingredient that is in a carrier layer portion of the carrier layer. The heating chamber extends between a first opening at a first end of the heating chamber and a second opening at a second end of the heating chamber and including a process gap. The thermal processing tool further includes a continuous carrier configured to hold on its surface a carrier layer comprising the absorber ingredient, and a moving mechanism to hold and move the continuous flexible workpiece and the continuous carrier within and through the process gap of the heating chamber so that the carrier layer portion of the carrier layer is delivered in proximity to the precursor layer portion of the precursor layer disposed on the surface of the continuous flexible workpiece during the reacting of the precursor layer portion with the part of the absorber ingredient that is in the carrier layer portion within the heating chamber. Another aspect of the present invention provides a multilayer stricture for forming solar cell absorbers by applying heat. The multilayer structure includes a base layer having a front surface and a back surface, a precursor layer formed on at least a substantial surface area portion of the front surface, and a carrier layer formed on at least one of a section of the back surface and a portion of the front surface that does not substantially overlap with the precursor layer. The carrier layer includes at least one of a Group VIA material and a Group IA material, and the precursor layer comprises at least one Group IB and at least one Group IIIA material.

Another aspect of the present invention provides a process of forming an absorber layer on a surface of a workpiece as the workpiece and a carrier are advanced through a rapid thermal processing (RTP) chamber. A precursor layer is disposed on the surface and an absorber constituent is disposed on the carrier. The process includes moving a portion of the carrier through a first opening into the RTP chamber, vaporizing the absorber constituent on the carrier within the RTP chamber thus forming an absorber constituent vapor, moving a portion of the workpiece through the first opening into the RTP chamber; and reacting the absorber constituent vapor and the precursor layer to form an absorber layer on the workpiece.

Yet another aspect of the present invention provides a process of forming an absorber layer on a workpiece. The workpiece comprises a layer of carrier material on a first portion of the workpiece and a layer of precursor material on a second portion of the workpiece, the carrier material comprising at least one of a Group VIA material and a Group IA material. The process includes moving the workpiece through a temperature profile, forming a carrier material vapor by vaporizing the layer of carrier material from the first portion of the workpiece, and reacting the carrier material vapor with the layer of precursor material on the second portion of the workpiece to form an absorber layer. The precursor layer comprises at least one Group IB and at least one Group IIIA material.

DESCRIPTION OF THE INVENTION

Figure 1:
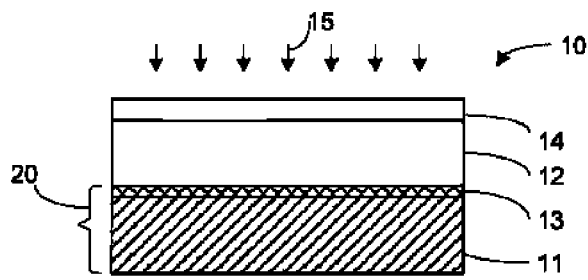
FIG. 1 is a schematic illustration of an exemplary solar cell structure of the prior art.

Present invention provides methods, structures and apparatus to carry out reaction of precursor layers for CIGS(S) type absorber formation, in an in-line manner, preferably in a roll-to-roll manner. In-line processing where the substrates carrying the precursor layers move continuously through a reactor is attractive for manufacturing. Roll-to-roll or reel-to-reel processing technology increases throughput and minimizes substrate handling. Furthermore, this technology allows high rate heating of substrates (RTP mode) without wasting energy. Unlike standard RTP chambers that function by rapid heating and cooling certain heating elements (such as a bank of lamps or IR heaters) which in turn heats a substrate placed in their proximity, the roll-to-roll RTP system of this invention has an elongated channel that is pre-heated to a temperature profile. Fast heating and cooling of any area on a substrate is achieved by moving the substrate through the channel and thus through the pre-determined temperature profile. Therefore, energy is conserved by not continuously heating and cooling the heating elements, which are traditionally high power lamps or heaters. Therefore, roll-to-roll RTP system and method of the present invention is a preferred method for large scale manufacturing.

$Cu(In,Ga)(Se,S)_2$ compound has Cu, In, Ga, Se and S as its elemental components or constituent elements. Out of these elements Cu, In and Ga are metallic constituents and exhibit low vapor pressures. Vapor pressure of these metallic constituents is less than about $10^{-10}$ Torr in the temperature range of 500-600° C. Non-metallic or semi-metallic constituent elements, Se and S, on the other hand have high vapor pressures which, in the temperature range of 500-600° C., are higher than about 10 Torr. Therefore, it is challenging to keep a Group VIA material vapor pressure over the precursor layer during a reaction carried out to form the compound.

In a two-stage process that involves forming a metallic precursor comprising Cu, In and Ga on a base, depositing a Group VIA material such as Se layer over the metallic precursor forming a precursor layer or structure, and subjecting the structure to a temperature of 400-600° C. in a batch RTP furnace with a temperature rise rate of around 10° C./sec, some of the Se at the top of the structure may vaporize before having a chance to fully react with Cu, In and Ga within the structure. It is for this reason that batch RTP reactors used for CIGS formation have small and sealed volumes and an excess amount of Se (such as an amount that is 20-50% more than what is needed to form the compound) is deposited over the metallic precursor. This way it is assured that there is excess Se overpressure in the RTP reactor which provides a sealed, small volume reaction environment to the precursor. Reactions carried out under Se-poor conditions would not result in high quality CIGS compound. Such Se deficiency would result in formation of undesirable binary phases of Cu—Se and/or In—Se and/or intermetallic compounds of Cu, In and Ga, such as $Cu_{11}(In,Ga)_9$, which would lower the photovoltaic quality of the absorber.

In a roll-to-roll RTP reactor, the reaction of a precursor layer deposited on a flexible foil base may be carried out in a continuous manner as the base comprising the precursor layer is continuously moved at a predetermined speed from a supply roll, through a heated channel (which is the RTP reactor) and to a receiving roll. The precursor layer in this case may comprise Cu, In and/or Ga, and Se and/or S. Examples of roll-to-roll RTP reactors are described in U.S. patent application Ser. No. 11/549,590 filed on Oct. 13, 2006 entitled "Method and Apparatus for Converting Precursor Layers into Photovoltaic Absorbers" and U.S. patent application Ser. No. 11/938,679 filed on Nov. 12, 2007 entitled "Reel-to-Reel Reaction of Precursor Film to Form Solar Cell Absorber, which are incorporated by reference herein. Since the flexible foil or the web has to enter and exit the heated channel through openings, this type of roll-to-roll reactor is not completely sealed as is the case for batch, small-volume conventional RTP reactors. Therefore, building an overpressure of a Group VIA material within such a roll-to-roll RTP reactor is challenging.

There may be various ways to address the issue of providing adequate amount of Group VIA material to the precursor layer during a RTP reaction. Let us take as an example the case of processing a "substrate/contact layer/metallic precursor/Se" structure in a roll to roll reactor of the present invention. The metallic precursor of this example may comprise Cu, In and Ga and the goal of the reaction step may be to form a "base/CIGS" or "substrate/contact layer/CIGS" configuration after the reaction step. One way of addressing the issue of Se loss from the roll-to-roll RTP reactor during the reaction is increasing the thickness of the Se layer over the metallic precursor. For example, 50-200% more Se may be deposited over the metallic precursor instead of the 20-50% excess, which is more common. Increasing the Se layer thickness, however, may cause problems such as poor morphology and adhesion problems in the CIGS layer formed as a result of the RTP reaction step. For example, to form a nominally 1-1.5 micrometers thick CIGS absorber a 0.8-1.5 micrometers thick Se film may normally be deposited over a metallic precursor comprising Cu, In and Ga and then the structure or precursor layer formed may be annealed in a RTP tool to form the CIGS compound. If the Se layer thickness is tripled to increase the Se overpressure in the reactor, the 2.4-4.5 micrometers thick Se film may melt when the temperature of the structure exceeds about 230° C. during reaction and such thick melt may form a liquid Se phase with non-uniform thickness over the metallic precursor due to poor wetting of the metallic precursor surface by the Se melt. Such non-uniform molten Se over the precursor surface interferes with the formation of high quality CIGS grains uniformly throughout the reacting structure. Therefore, it is more desirable to provide the excess Se to the surface of the reacting precursor layer in a gaseous form rather than in the form of a melt.

The present invention provides a method and apparatus such as a roll-to-roll rapid thermal processing (RTP) apparatus or chamber employing a constituent delivery surface, which provides at least one constituent of the solar cell absorber to a surface of a continuous flexible workpiece at a reaction channel or stage, to form a solar cell absorber layer by reacting with the other constituents that are present within a precursor layer on the surface of the continuous flexible workpiece. A layer disposed on the constituent delivery surface, which will be referred to as carrier layer throughout the description, may comprise the constituent of the absorber. It should be noted that the constituent that is provided to the precursor layer for reaction is not in or on the precursor layer itself, but it comes from a location that is different than where the precursor layer is.

Figure 2:
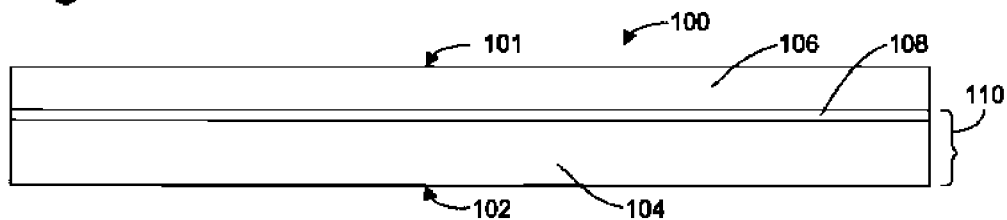
FIG. 2 is a schematic illustration of a continuous flexible workpiece having a precursor layer.

FIG. 2 exemplifies a continuous flexible workpiece 100 having a top surface 101 and a bottom surface 102, which will be referred to as workpiece in the following embodiments. The workpiece may, for example, be 10 to 2000 meters in length and 0.1 to 2 meters in width. The bottom surface 102 of the workpiece 100 may also be the back surface of a substrate 104, while the top surface is the front surface of a precursor layer 106 or stack. A contact layer 108 may be placed between the substrate 104 and the precursor layer 106. The contact layer 108 and the substrate 104 will be referred to as a base 110 of the workpiece 100. The substrate 104 may be a conductive material such as a metal or alloy, for example, flexible steel web, or a nonconductive material, for example, a polymer web. In the following embodiments, the substrate 104 is preferably a steel web having a thickness about 25-125 micrometers, preferably 50-75 micrometers. The contact layer 108 may comprise conductors such as Mo, W, Ru, Os and Ir and may be 200-1000 nm thick, preferably 300-500 nm thick. Dimensions of the various layers in the figures are exemplary and are not drawn to scale.

The precursor layer 106 may be formed by depositing absorber constituents belonging to Group IB and Group IIIA of the periodic table, such as copper (Cu), gallium (Ga) and Indium (In), on the contact layer 108 of the workpiece 100 using any deposition method such as electroplating, sputtering, nano particle coating and the like. The precursor layer 106 or stack may have a thickness in the range of 400-1000 nm, preferably, 500-700 nm. To form an absorber layer, the precursor layer 106 must be reacted in presence of excess Group VIA constituents such as Se, Te and S. It may also be beneficial to introduce Group IA dopant materials (Na, Li and K) into the forming compound.

Figure 3:
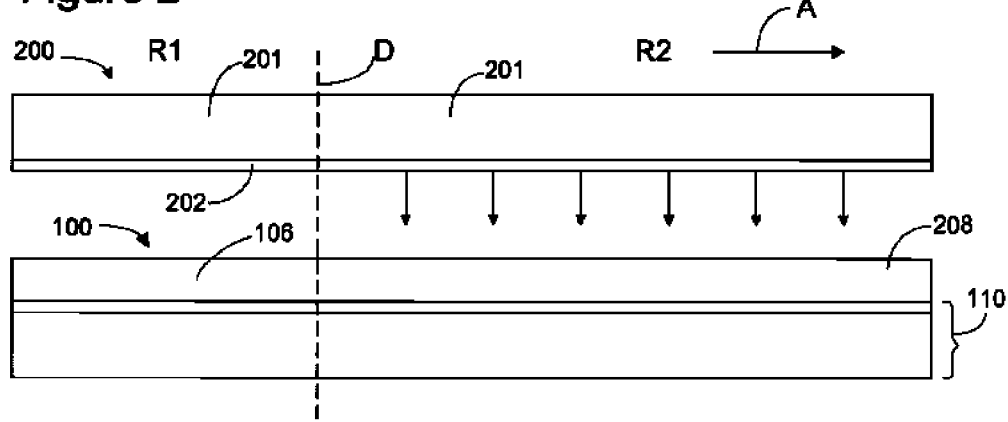
FIG. 3 is a schematic illustration of an embodiment of the process of the present invention, wherein a continuous carrier having a carrier layer and the continuous flexible workpiece having the precursor layer are advanced into an RTP chamber of the present invention.

The present invention employs, in certain embodiments, a holding vehicle, also referred to as a carrier, that may be the same as or different from the workpiece 100 that has the precursor layer 106 thereon. In one embodiment, the constituent delivery surface may be a surface of the carrier, which is used alongside the continuous flexible workpiece within the roll-to-roll RTP apparatus of the present invention. A carrier layer comprising any of the volatile constituents or ingredients which may be needed during the formation of an absorber layer such as a CIGS(S) layer is disposed on the carrier surface. During the reaction, the carrier layer disposed on the carrier surface evaporates and the constituent material reacts with the precursor layer As will be described more fully below, in one embodiment, during the reaction, the constituent present in the carrier layer evaporates or vaporize and react with the constituents of the precursor on the workpiece surface to form the absorber layer which may be a semiconductor film. FIG. 3 illustrates an embodiment of the present invention to deliver a Group VIA material constituent of the absorber layer from a continuous carrier 200 to the precursor layer 106 including Group IB and Group IIIA materials on the workpiece 100. In this case the continuous carrier 200 is different than the workpiece 100 which comprises the precursor layer 106. As will be described below, the continuous carrier 200 may include a flexible foil 201 and a carrier layer 202 containing the constituent to be reacted with the precursor 106 on the workpiece 100. In this embodiment, at a pre reaction region R1, the continuous carrier 200 includes the carrier layer 202 including at least one Group VIA material such as Se as an absorber layer ingredient, and the workpiece 100 includes precursor layer 106. Equivalent thickness of the Group VIA material such as Se within the carrier layer 202 may be in the range of 0.5-50 micrometer or even more, larger thickness providing more Se vapor for the reaction of the precursor layer 106. A line 'D' represents an approximate point within a reaction environment such as an RTP chamber of the present invention, where the carrier layer 202 begins vaporizing and the vapor reacts with the precursor layer 106 on the workpiece in a reaction region R2. As shown in FIG. 3, at the reaction region R2 with the applied heat, the constituents of the carrier layer 202 are substantially removed from the continuous carrier 200 by evaporation or vaporizing and helps form the absorber layer 208 by reacting with the precursor layer 106. During the reaction both the workpiece 100 and the continuous carrier are moved in the direction of the arrow A within a reaction environment. The speed of the workpiece and the continuous carrier may or may not be the same.

Figure 4A:
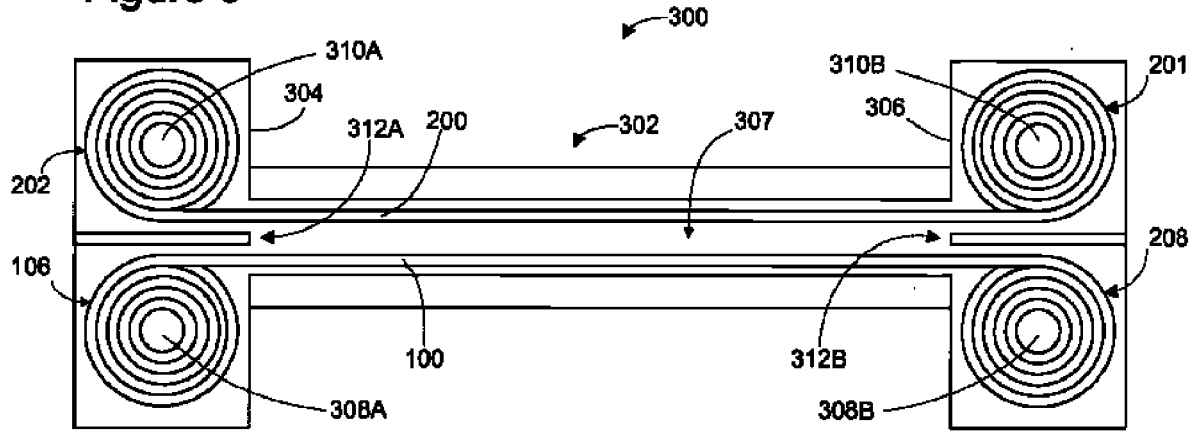
FIG. 4A is a schematic illustration of an embodiment of a roll to roll RTP system of the present invention.

FIG. 4A illustrates one embodiment of a roll-to-roll RTP tool 300 to perform the process described above in connection to FIG. 3. The RTP tool 300 comprises a heating chamber 302, a supply chamber 304 and a receiving chamber 306. The heating chamber may preferably be a metallic or quartz chamber having a predetermined temperature profile. Heating zones may be established along the body of the heating chamber using heaters installed internally or externally. A moving mechanism (not shown) holds and moves the workpiece 100 having the precursor layer 106 and the continuous carrier 200 having the carrier layer 202 through a process gap 307 of the heating chamber 302 using a workpiece feed roller 308A and a workpiece receiving roller 308B as well as a carrier feed roller 310A and a carrier receiving roller 310B, which are positioned adjacent both ends of the process chamber 702. The rollers 308A, 310A and 308B, 310B are placed in the supply chamber 304 and the receiving chamber 306, respectively. The chambers 304 and 306 are vacuum-sealable to evacuate the RTP tool 300 to remove air from the reaction environment.

In this embodiment, the workpiece 100 is processed in the heating chamber 302 while it is extended through the heating chamber 302 and between the feed roller 308A and the receiving roller 308B. An unprocessed portion of the workpiece 100, i.e., the portion with the precursor layer 106, is wrapped around the workpiece feed roller 308A while the processed portion, i.e. the portion with the absorber layer 208 is wrapped around the workpiece receiving 308B. The workpiece 100 and the continuous carrier 200 enter the heating chamber 302 through the first opening 312A of the process gap 307 of the heating chamber 302 and after the absorber layer 208 is formed on the base 110 by addition of the constituents from the continuous carrier 200, both the workpiece 100 and the continuous carrier 200 leave the heating chamber 302 through the second opening 312B.

Preferably, in the process gap 307 the continuous carrier 200 is positioned across from the workpiece 100 so that the carrier layer 202 faces the precursor layer 106 although it is possible to place the carrier layer 202 near one or both sides of the workpiece 100, even behind the workpiece 100 provided that there is a pathway for the volatile species from the carrier layer 202 to travel to the front surface of the workpiece 100. In this configuration, the volatile species or constituents, such as Se, S, Te, Na, K, Li, etc., from the surface of the carrier layer 202 conveniently vaporize and get included into and/or support the reaction of the precursor layer of the workpiece 100. It should be noted that Se, S, Te, Na, K, Li, etc. may also be called absorber ingredients since the absorber formed as a result of the reaction process comprises at least one of these species. The movement of the continuous carrier 200 by the moving mechanism using the rollers 310A and 310B is similar to the movement description of the workpiece 100 given above. However, the motions of the workpiece 100 and the continuous carrier 200 may or may not be coupled to each other. The speed of the continuous carrier may be decreased or increased compared to the speed of the workpiece 100 to adjust the amount of the volatile constituents introduced into the heating chamber. As the carrier speed is increased, for example, more of the carrier layer is brought into the hot zone per unit time, and therefore, the amount of the volatile constituents provided by the carrier layer is increased. This way best reaction conditions (such as amount of Group VIA materials or Group IA materials in the heated zone or reaction zone) may be set to grow high quality solar cell absorbers.

The continuous carrier 200 is heated in the heating chamber 302 to evaporate the carrier layer 202 while the continuous carrier 200 is extended through the heating chamber 302 and between the carrier feed roller 310A and the carrier receiving roller 310B. An unused portion of the workpiece is wrapped around the carrier feed roller 310A while the used portion of the continuous carrier, i.e., the flexible foil 201 without the carrier layer 202, is wrapped around the receiving roller 308B.

In operation, the workpiece 100 and the continuous carrier 200 are unwrapped from their respective rollers and advanced into the heating chamber 302. They may be moved continuously or incrementally, with the same speed or differing speeds. However, at the beginning of the process, first, a predetermined length of the continuous carrier 200 may be solely fed into the heating chamber 302, without being accompanied by the workpiece 100. This way, the portion of the carrier layer within the heating chamber 302 may be vaporized to establish a pre-process constituent vapor pressure such as a pre-process Se vapor pressure in the heating chamber. The predetermined length of the continuous carrier 200 for this operation may be equal to the length of the heating chamber 302. The length of the heating chamber may be 1-15 meters. The temperature profile of the heating chamber may have a maximum temperature in the range of 400-600° C. Speed of the workpiece 100 and/or the continuous carrier 200 may be in the range of about 0.25-15 meters/min depending on the length of the heating chamber, longer chamber lengths allowing faster processing speeds.

In terms of the movement, for example, both receiving rollers 308B and 3110 B may be separately or together coupled to a drive motor (not shown) to rotate them to wrap the workpiece and the continuous carrier around them and hence advancing them. The supply rollers 308A and 310A meantime can be separately or together coupled to an adjustable clutch which cooperates with the drive motor to advance the workpiece and the continuous carrier into the heating chamber 302 while maintaining them in a state of tension.

Figure 4B:
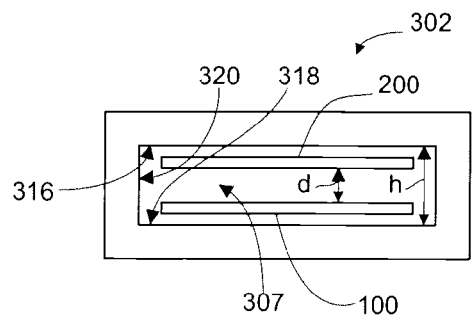
FIG. 4B is a schematic cross sectional illustration of an RTP chamber of the roll to roll RTP system shown in FIG. 4A.

FIG. 4B is an illustration of a cross section of a heating chamber 302 of the present invention. A top wall 316, a bottom wall 318 and side walls 320 define the process gap 307 where the workpiece 100 and the continuous carrier 200 are disposed during the rapid thermal processing stage of the present invention. In this embodiment, the top wall 316 and the bottom wall 318 may preferably be parallel to one another and the height 'h' of the process gap 307 is constant along the length of the heating chamber. A preferred range for the height 'h' may be in the range of 0.1-2 cm, preferably in the range of 0.3-1 centimeters (cm). Further, in this embodiment, the distance between the workpiece and the continuous carrier, which is depicted as "process distance", d, is substantially constant along the length of the heating chamber 302. A preferred range for the process distance 'd' may be in the range of 0.1-1 cm, preferably 0.2-0.5 cm.

Figure 4C:
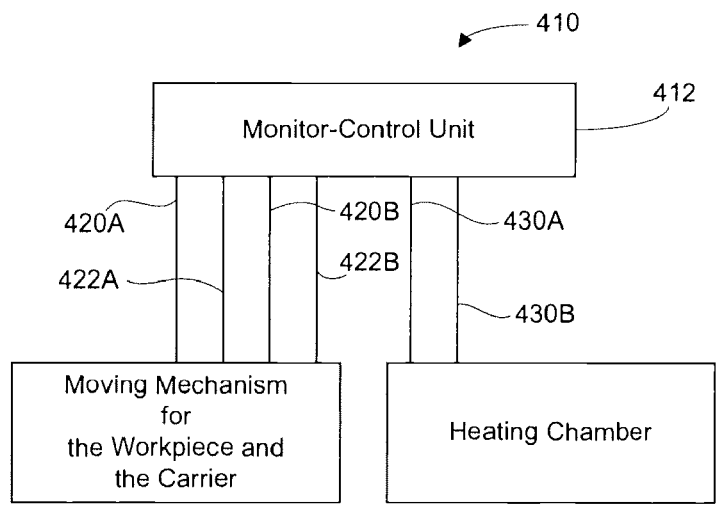
FIG. 4C is a monitor control system that is used in the embodiment of FIG. 4A of the present invention.

FIG. 4C shows a control system 410 to control and monitor the reel-to-reel processing system described above. While the control system can be adapted for the various embodiments shown, it will be described herein with respect to the embodiment of FIG. 4A. The control system 410 includes a monitor-control unit 412, which unit 412 is used to monitor and/or control each of the speed of movement of each of the workpiece 100 and the continuous carrier 200 as they are unwrapped from their respective rollers and advanced into the heating chamber 302, as well as monitor and control the heating chamber 302 such as the temperature of the heated zones and flow rates of gases that may be introduced into the heated chamber.

While the monitor-control unit 412 is shown as a single unit, it is understood that the monitor-control functions as described herein can be distributed, such that individual monitor and/or control of the various mechanisms and units can occur. Preferably, the monitor-control unit 412 is integrated to allow for better real-time changes to be made to the processing conditions, and as such a description of such monitor and control is provided hereinafter, though it will be readily apparent that specific monitors and controls can be independently performed. In the preferred embodiment, the monitor-control unit 412 is preferably implemented using a computer with a processor and which contains application software that will receive the monitor signals, and, according to a program that determines the desired profile for the resulting structure, control each of the different mechanisms and units as described herein. Given the descriptions herein, the manner in which this programming is implemented will be apparent.

In a preferred embodiment, the monitor-control unit 412 will monitor and control the speed of the moving mechanisms for the workpiece 100 and the continuous carrier 200, with a speed monitor signals 420A, 422A and a speed control signals 420B and 422B, such that the monitor signals 420A and 422A indicate the actual speed of the workpiece 100 and the continuous carrier 200, respectively, and the control signals 420B and 422B adjust the actual speed of the drive motors that control the speeds. Controlling and monitoring the speed allows for adjusting the amount of constituent material that is in the heating chamber 302 for the time that a given portion of the workpiece is in the heating chamber.

In this preferred embodiment, the monitor-control unit 412 will also monitor and control the heating chamber 302, by having a reacting temperature monitor signal 430A and a reacting temperature control signal 430B associated with the heating chamber 302, such that the reacting temperature is controlled, preferably in accordance with the overall profile, thereby ensuring that the appropriate reaction takes place as described herein. Furthermore other signals may be used to control the flow rates of various gases that may be introduced into the heating chamber 302 at various times during the process.

Figure 5:
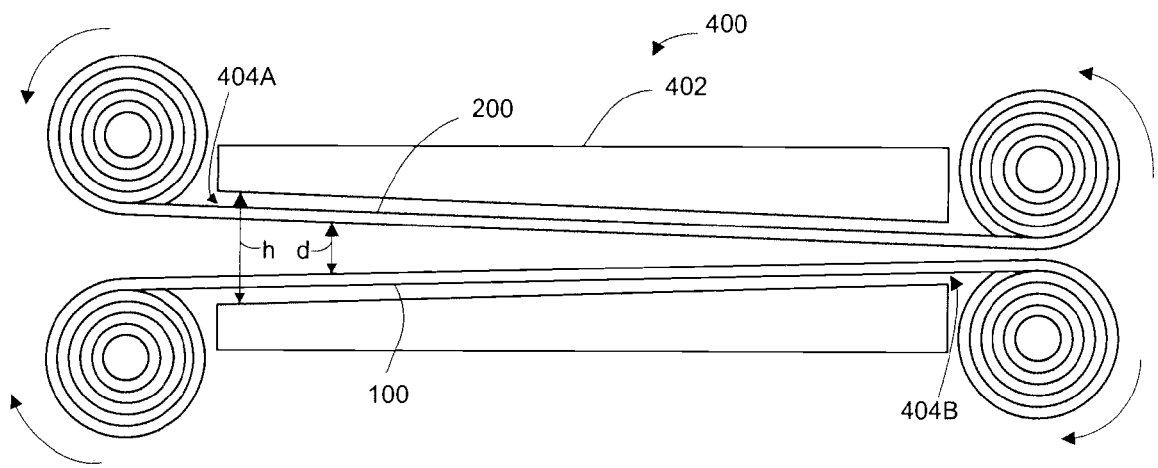
FIG. 5 is a schematic illustration of an alternative embodiment of a roll to roll RTP system of the present invention.

FIG. 5 shows an alternative RTP tool 400. The RTP tool 400 differs from the RTP tool 300 shown in FIGS. 4A and 4B by its varying process gap height 'h' and the process distance 'd'. The rest of the RTP tool 400 is substantially the same as the RTP tool 300 and the process is performed in substantially the same way. In this configuration, the process gap height and the process distance are larger at a first opening 404B of the heating chamber and smaller at a second opening 404B of the heating chamber. This configuration brings the continuous carrier and the workpiece closer, even to physical contact, near the second opening, which restricts the constituent, i.e., a Group VIA material gas or vapor, and reduces or eliminates its escape from the second opening. This in turn increases constituent vapor pressure and contributes to the efficiency and materials utilization of the absorber formation process. Since the absorber layer is already formed before the opening 404B, the workpiece surface may touch the surface of the continuous carrier at this location, especially if both are moving at the same speed. The process gap height may be uniformly reduced towards the second opening 404B. Similarly, the process gap or distance, 'd', may be gradually reduced between the continuous carrier 200 and the workpiece 100.

In the above embodiments, the constituent delivery surface on which the carrier layer is disposed is the surface of the continuous carrier which is fed into a heating chamber along with the continuous workpiece having the precursor layer. In another embodiment, however, the constituent delivery surface may be a back surface or a portion of the front surface of the continuous flexible workpiece. In this respect, the surface of the continuous flexible workpiece may contain a precursor stack or layer and the carrier layer may be disposed a back surface of the continuous flexible workpiece. Alternatively, the carrier layer may be disposed on a portion of the top surface that is not covered by the precursor layer. During the reaction, a constituent in the carrier layer evaporates and reacts with the precursor layer on the top surface of the workpiece. As will be described below, it is also possible to have the carrier layer be an integral part of the workpiece. In this case, the constituent that will be provided for the reaction of a precursor layer on a workpiece is deposited on the same workpiece as the precursor layer, only substantially on areas of the workpiece where there is no precursor layer. In that respect, if the precursor layer is on one surface of the workpiece, the carrier layer may be in the other surface. Alternately, if the precursor is deposited on a first portion of a top surface of the workpiece, the carrier layer may also be on the top surface however on a portion that is different from the first portion. For example, in the case of a long and narrow workpiece, such as a 50 cm wide and several hundred meters long, the precursor layer may be deposited on a first surface of the workpiece leaving some edge exclusion regions, i.e. the precursor layer may be deposited on the center portion which may be 46 cm wide leaving 2 cm edge exclusion at the two edges along the precursor layer. The carrier layer, in this case, may be located at the two 2 cm wide edge exclusion zones. Alternately, some portions along the length of the workpiece may not be coated by the precursor layer, and these portions may comprise the carrier layer.

Figure 6:
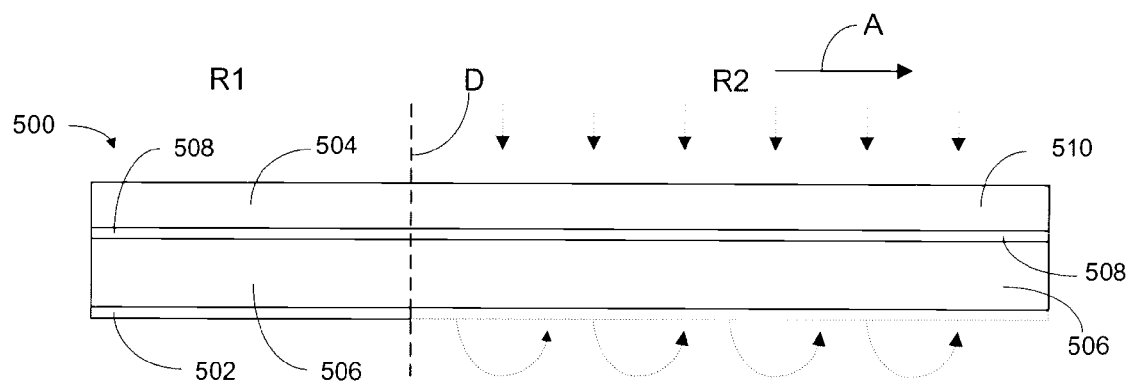
FIG. 6 is a schematic illustration of an embodiment of the process of the present invention, wherein a continuous flexible workpiece having a precursor layer on one side and a carrier layer on another side is advanced into an RTP chamber of the present invention.

FIG. 6 illustrates an embodiment of the present invention to deliver a Group VIA and/or a Group IA material constituent of the absorber layer from a carrier layer on a back surface of a workpiece 500 to the precursor layer 504 including Group IB and Group IIIA materials on a top surface of the workpiece 500. In this embodiment, at a pre reaction region R1, the workpiece 500 includes the carrier layer 502 including at least one Group VIA material such as Se, the flexible substrate 506, the contact layer 508 and the precursor layer 504. A line D represents an approximate point within a reaction environment such as an RTP chamber of the present invention, where the carrier layer 502 begins evaporating and reacts with the precursor layer 504 on the workpiece 500 in a reaction region R2. At the reaction region R2, with the applied heat, the carrier layer 202 is removed from the back surface by evaporation and forms the absorber layer 510 by reacting with the precursor layer 504. During the reaction the workpiece 500 is moved in the direction of arrow A within the reaction environment. In operation using a roll-to-roll RTP tool, the workpiece 500 is unwrapped from a roller and advanced into a heating chamber. However, at the beginning of the process, first, a predetermined length of the workpiece may be solely fed into the heating chamber. This predetermined length may not contain the precursor layer 504 at the top surface but contains the carrier layer 502 at the back surface or at the front surface. The carrier layer at the back surface or the front surface of the predetermined length is vaporized in the RTP chamber to establish a pre-process constituent vapor pressure such as a Se vapor pressure in the heating or RTP chamber before the rest of the workpiece including both the precursor and the carrier layer is moved into the heating chamber. This way waste of costly precursor layers is avoided. It should be noted that precursor layers that are moved into the heating chamber without establishing a pre-process constituent vapor pressure may not yield high quality CIGS type absorbers because of lack of excess Se overpressure within the heating chamber at the beginning of the process. The predetermined length of the workpiece for this pre-process operation maybe equal to the length of the heating chamber. Further, the invention is described for flexible substrates those skilled in the art would recognize that rigid substrates and rigid carriers or the like may be utilized.

Figure 7A:
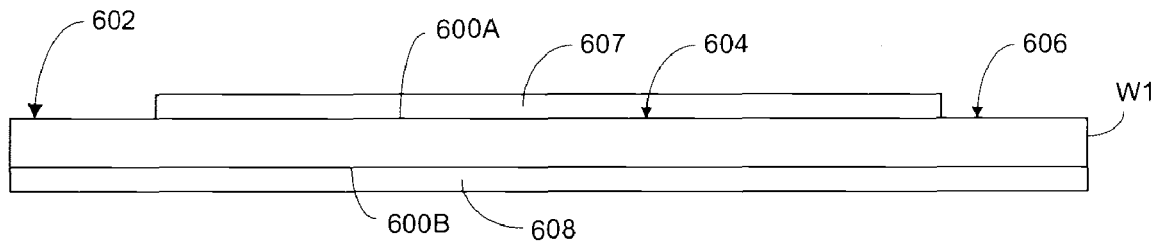
FIGS. 7A-7D are schematic illustrations of various continuous flexible workpiece structures including precursor layers and carrier layers disposed on various portions of the workpieces.
Figure 7B:
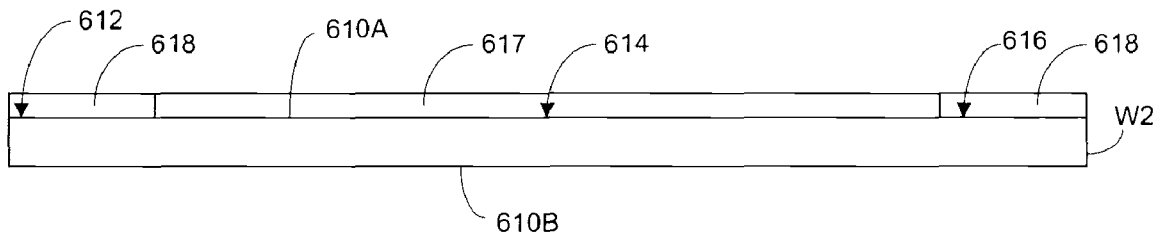
Figure 7C:
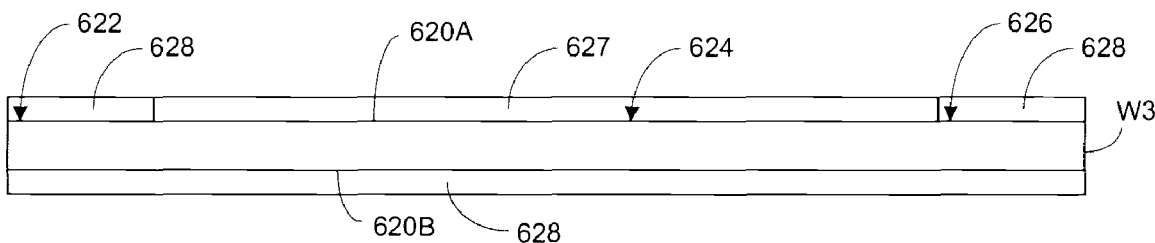
Figure 7D:
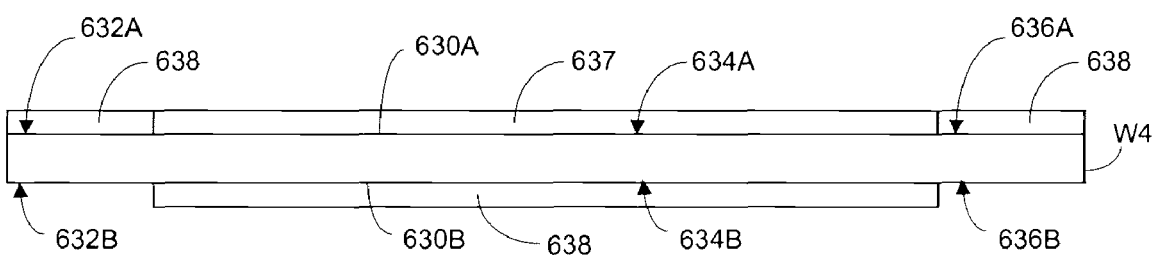

In FIGS. 7A-7D, examples of forming carrier layers on back and/or top surfaces of various workpieces are illustrated. In FIG. 7A, a top surface 600A of a workpiece W1 includes a first end portion 602, a middle portion 604 and a second end portion 606. A precursor layer 607 is formed on the middle portion 604; and a carrier layer 608 is formed on a back surface 600B of the workpiece W1. The carrier 608 may or may not cover substantially all of the back surface 600B. In FIG. 7B, a top surface 610A of a workpiece W2 includes a first end portion 612, a middle portion 614 and a second end portion 616. A precursor layer 617 is formed on the middle portion 604; and a carrier layer 618 is formed on the first end portion 612 and the second end portion 616. The carrier layer 618 may or may not touch the edges of the precursor layer 617. In this configuration, a back surface 610B of the workpiece W1 may or may not contain a carrier layer. In FIG. 7B no carrier layer is shown on the back surface 610B. In FIG. 7C, a top surface 620A of a workpiece W3 includes a first end portion 622, a middle portion 624 and a second end portion 626. A precursor layer 627 is formed on the middle portion 624; and a carrier layer 628 is formed on the first end portion 622, a second end portion 626 and a back surface 620B of the workpiece W1. It should be noted that the carrier layer 628 may only cover parts of the first end portion 622 and/or the second end portion 626 and/or the back surface 620B. In FIG. 7D, a top surface 630A of a workpiece W4 includes a first end portion 632A, a middle portion 634A and a second end portion 636A. In this configuration, a back surface 630B of the workpiece W4 includes a first end portion 632B, a middle portion 634B and a second end portion 636B. As shown, a precursor layer 637 is formed on the middle portion 634A of the top surface 630A; and a carrier layer 638 is formed on the first and second end portions 632, 636 of the top surface 630A and the middle portion 634B of the back surface 630B of the workpiece W1.

As will be apparent to those skilled in the art, there are many other ways of distributing the precursor layers and the carrier layers on a workpiece, rather than using both a carrier and a workpiece as described above. In one preferred method of the present invention, these two types of layers distributed so that they do not interact with each other to any appreciable degree, i.e. they are deposited on different portions of the workpiece, as described further below. In the preferred methods of the present invention, the precursor layer comprises Cu and at least one of In and Ga. It is preferred that the precursor layer further comprises at least one Group VIA material, such as Se, S and Te. The precursor layer may also comprise a dopant such as a Group IA material. Group IA materials include Na, Li and K. The carrier layer preferably comprises at least one of a Group VIA material and a Group IA material.

Carrier layers of the present invention may be formed on the workpiece or continuous carriers by various techniques using different apparatus. These techniques include but are not limited to physical vapor deposition (such as evaporation), chemical vapor deposition, or the like. One preferred method is deposition of a slurry or ink using techniques such as screen printing, inkjet printing, doctor-blading, spraying, painting etc. In this method, the slurry or ink may comprise the constituents of the carrier layer. In one embodiment of the present invention, the process of carrier layer deposition may be integrated with a roll-to-roll rapid thermal processing.

Accordingly, a slurry or ink comprising a Group VIA material (such as Se and/or S) may be prepared and delivered onto a workpiece before the rapid thermal processing by utilizing a slurry/ink delivery system. A delivery unit of the delivery system may be placed at a location in between a supply roll from which a continuous flexible workpiece comprising a precursor layer is unrolled, and the inlet opening of a RTP furnace where the continuous flexible workpiece enters the RTP chamber. A Group IA material such as Na may optionally be included in the formulation of the ink or slurry. After a portion of the flexible workpiece leaves the delivery roll and moves toward the inlet opening of the furnace or heater, a slurry/ink delivery system such as a nozzle, a printing pad etc. deposits the slurry/ink onto a predetermined portion of the flexible workpiece, forming a carrier layer. As explained before, the predetermined portion may be on a front surface or a back surface of the flexible workpiece, preferably in areas without the precursor layer. The portion of the flexible workpiece comprising the precursor layer and the freshly deposited carrier layer then enters the heated zone of the furnace through the inlet opening and the RTP process is carried out.

Figure 8:
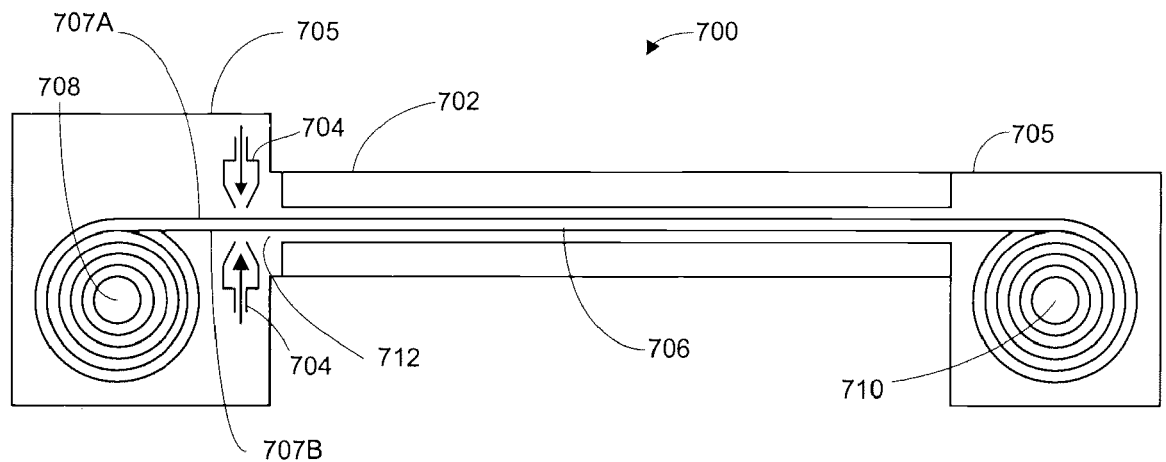
FIG. 8 is a schematic illustration of an embodiment of a roll to roll RTP system of the present invention, wherein the system includes at least one delivery unit to deposit carrier layer constituents onto a continuous flexible workpiece.

FIG. 8 shows an exemplary roll to roll system 700 including a heating chamber 702 and one or more delivery units 704 to perform the above described combined process. The system 700 is in a vacuum sealable enclosure 705. A continuous flexible workpiece 706, having a top surface 707A and a back surface 707B, extended from a feed roll 708 to a receiving roll 710. The top surface 707A includes a precursor layer (not shown). The delivery units 704 may be positioned between the feed roll 708 and entrance 712 of the heating chamber. In one embodiment, the delivery units 704 may be nozzles to deliver constituents of the carrier layer or deposit the carrier layer onto the workpiece 706. By utilizing the delivery units 704, the carrier layer is formed on various portions of the top surface and/or the back surface of the continuous flexible workpiece 706, preferably in a location that is different from and not over precursor layer. Some of the exemplary structural configurations of a carrier layer on a workpiece having a precursor layer are shown in FIGS. 7A-7D. It should be noted that the same process may also be used to paint carrier layers on continuous carriers of FIGS. 4A and 4B.

Although the present invention is described with respect to certain preferred embodiments, modifications thereto will be apparent to those skilled in the art.

I claim:

1. A thermal processing tool for forming a solar cell absorber from a precursor layer disposed on a surface of a continuous flexible workpiece, the tool comprising:
    a heating chamber to cause therein reacting of a precursor layer portion of the precursor layer with an adjacent portion of a carrier layer to thereby transform the precursor layer into the solar cell absorber, the heating chamber extending between a first opening at a first end of the heating chamber and a second opening at a second end of the heating chamber and including a process gap therebetween, the process gap defined by a top wall, a bottom wall, and sidewalls, wherein the process gap has an elongated shape with a length of at least one meter, a width between the sidewalls that is wider than a width of the flexible workpiece and a height between the top wall and the bottom wall in at least a part of the process gap that is 2 cm or less, wherein the process gap collects carrier layer vapor that forms from the adjacent portion of the carrier layer and reacts with the precursor layer portion;
    a continuous carrier configured to hold on a surface thereof the carrier layer comprising an absorber ingredient, wherein the absorber ingredient includes a Group VIA material; and
    a moving mechanism to hold and move the continuous flexible workpiece and the continuous carrier within and through the process gap of the heating chamber so that the adjacent portion of the carrier layer is delivered in proximity to the precursor layer portion of the precursor layer disposed on the surface of the continuous flexible workpiece during the reacting, wherein the proximity of a top surface of the adjacent portion of the carrier layer to a top surface of the precursor layer in at least a part of the process gap is 1 cm or less.

2. The tool of claim 1 further including a monitor-control unit that controls applying a predetermined temperature profile within the heating chamber to control the reacting.

3. The tool of claim 2 wherein the moving mechanism includes a first supply roll to feed previously unrolled portions of the continuous carrier into the heating chamber through the first opening at the first end of the heating chamber and a first receiving roll to take up and wrap used portions of the continuous carrier which exits through the second opening at the second end of the heating chamber.

4. The tool of claim 3 wherein the moving mechanism further includes a second supply roll to feed previously unrolled portions of the continuous flexible workpiece into the heating chamber through the first opening and a second receiving roll to take up and wrap processed portions of the continuous flexible workpiece.

5. The tool of claim 4, wherein the length of the heating chamber is in the range of 1 to 15 meters.

6. The tool of claim 4 further including a delivery unit that deposits the carrier layer on the surface of the continuous carrier.

7. The tool of claim 3 further including a delivery unit that deposits the carrier layer on the surface of the continuous carrier.

8. The tool of claim 1, wherein the top wall and the bottom wall of the process gap are parallel to one another and the surface of the carrier layer is positioned with respect to a surface of the precursor layer disposed on the continuous flexible workpiece so that the precursor layer and the carrier layer face each other within the process gap.

9. The tool of claim 8, wherein the surface of the precursor layer disposed on the continuous flexible workpiece and the surface the carrier layer are substantially parallel to one another within the process gap.

10. The tool of claim 1 further including a delivery unit that deposits the carrier layer on the surface of the continuous carrier.

11. The tool of claim 1 wherein the absorber ingredient further includes a Group IA material.

* * * * *